United States Patent [19]

Mintz

[11] Patent Number: 4,865,712
[45] Date of Patent: * Sep. 12, 1989

[54] APPARATUS FOR MANUFACTURING PLANARIZED ALUMINUM FILMS

[75] Inventor: Donald M. Mintz, Sunnyvale, Calif.

[73] Assignee: Varian Associates, Inc., Palo Alto, Calif.

[*] Notice: The portion of the term of this patent subsequent to Jun. 17, 2003 has been disclaimed.

[21] Appl. No.: 80,200

[22] Filed: Jul. 28, 1987

Related U.S. Application Data

[60] Continuation of Ser. No. 19,164, Feb. 26, 1987, abandoned, which is a division of Ser. No. 863,745, May 15, 1986, Pat. No. 4,661,228, which is a continuation-in-part of Ser. No. 811,595, Dec. 19, 1985, Pat. No. 4,627,904, which is a continuation-in-part of Ser. No. 759,722, Jul. 29, 1985, abandoned, which is a continuation-in-part of Ser. No. 611,435, May 17, 1984, Pat. No. 4,595,482.

[51] Int. Cl.$^4$ ............................................. C23C 14/34
[52] U.S. Cl. .............................. 204/298; 204/192.12
[58] Field of Search ............... 204/192.12, 192.25, 204/298, 192.15, 298 ME, 298 SG, 298 PM, 298 CM

[56] References Cited

U.S. PATENT DOCUMENTS

| | | | |
|---|---|---|---|
| 3,755,123 | 8/1973 | Davidse et al. | 204/298 X |
| 3,884,793 | 5/1975 | Penfold et al. | 204/298 |
| 3,892,650 | 7/1975 | Cuomo et al. | 204/298 X |
| 4,116,791 | 9/1978 | Zega | 204/298 X |
| 4,116,793 | 9/1978 | Penfold et al. | 204/298 X |
| 4,132,614 | 1/1979 | Cuomo et al. | 204/298 X |
| 4,278,528 | 7/1981 | Kuehnle et al. | 204/298 |
| 4,444,635 | 4/1984 | Kobayashi et al. | 204/298 X |
| 4,581,118 | 4/1986 | Class et al. | 204/298 |
| 4,627,904 | 12/1986 | Mintz | 204/298 |

FOREIGN PATENT DOCUMENTS

| | | |
|---|---|---|
| 136230 | 7/1985 | Japan . |
| 152671 | 8/1985 | Japan . |

Primary Examiner—Nam X. Nguyen
Attorney, Agent, or Firm—Stanley Z. Cole; Kenneth L. Warsh; Gerald M. Fisher

[57] ABSTRACT

An apparatus for planarizing an aluminum layer on a semiconductor wafer includes two deposition sources. The first source applies a refractory metal silicide layer to form a barrier to oxygen. The wafer is moved to a second deposition source which is an aluminum sputter device including a heater for the wafer, R.F. bias on the wafer and a magnetic mirror behind the wafer to move the plasma away from the wafer.

5 Claims, 8 Drawing Sheets

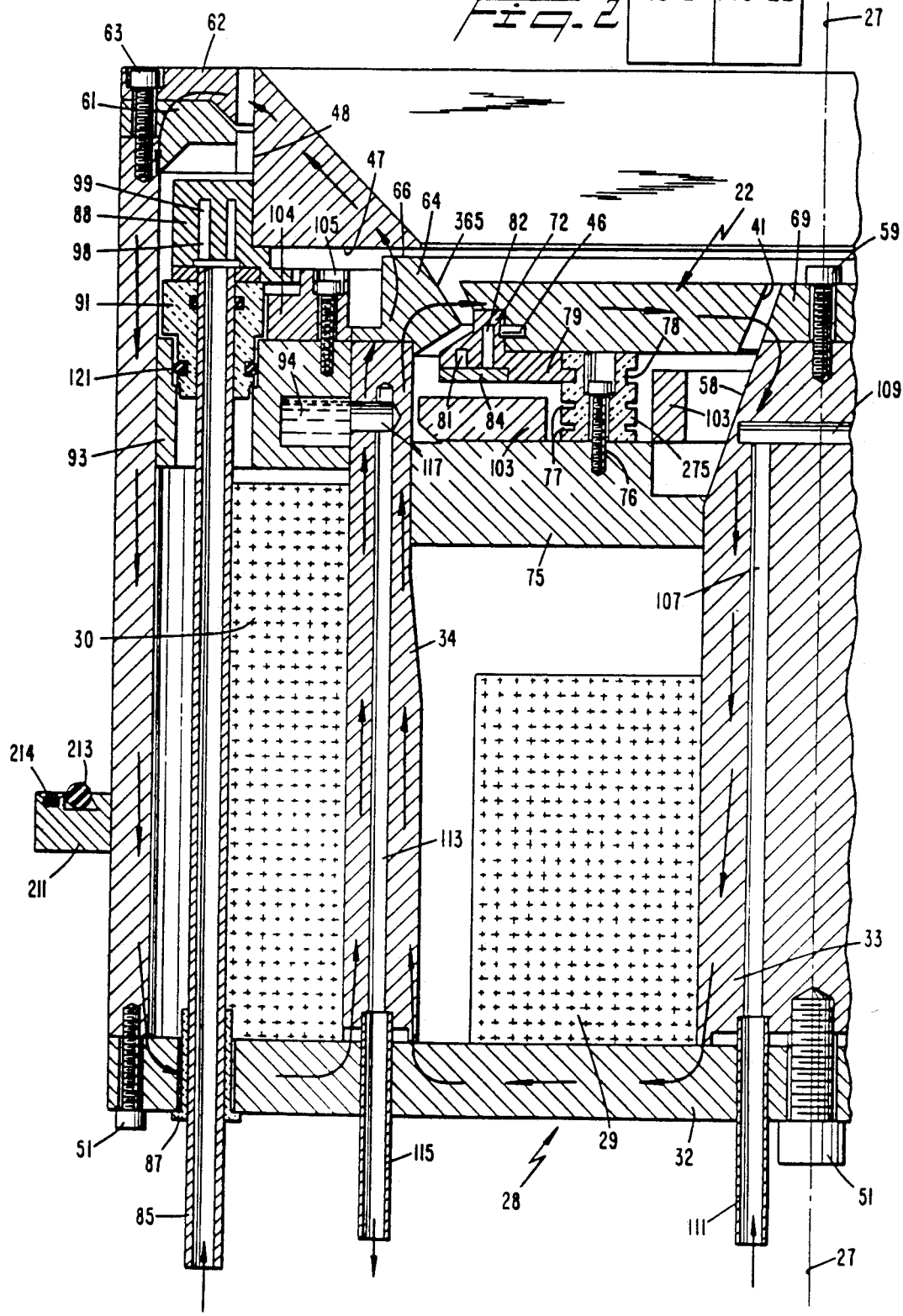

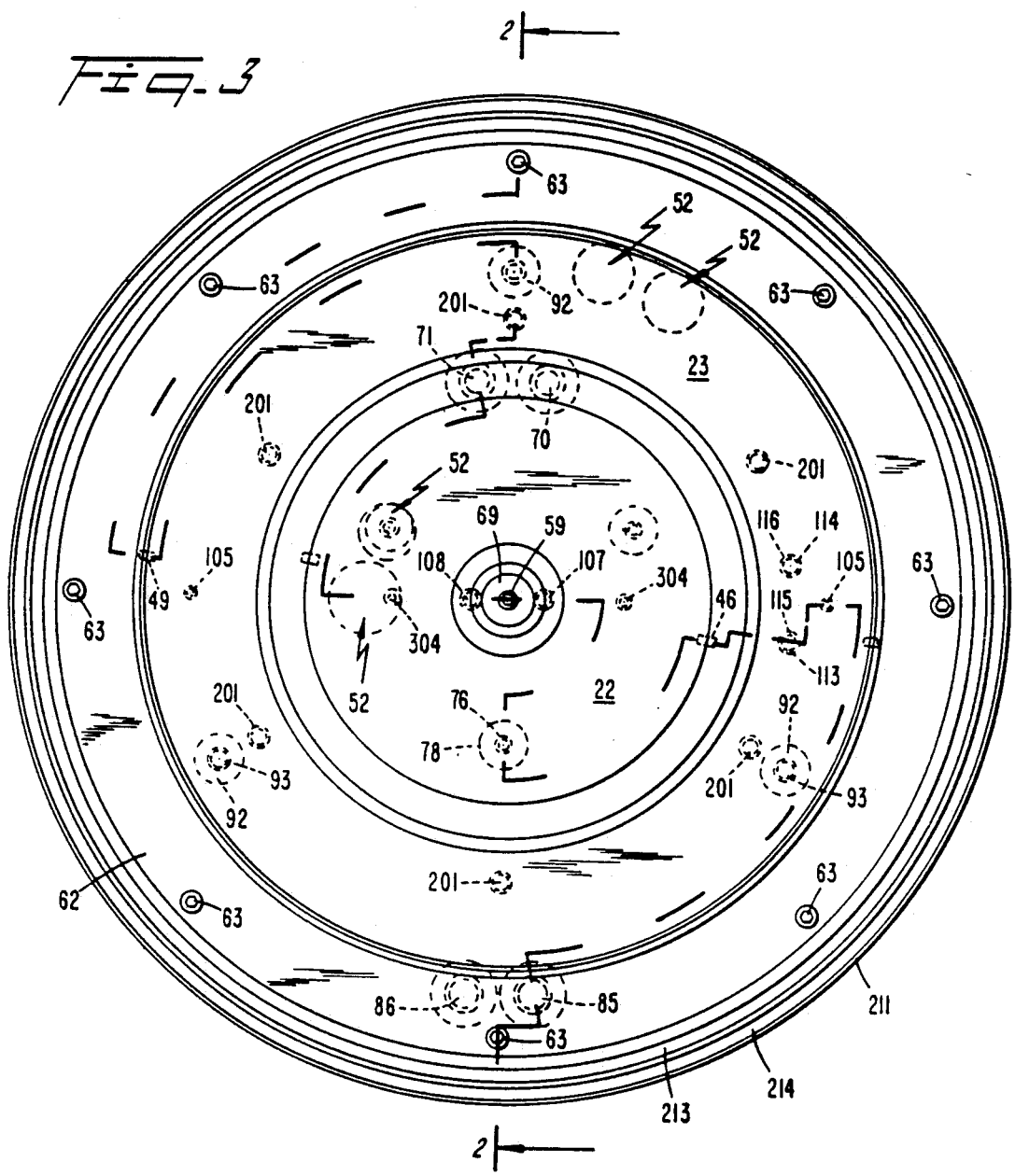

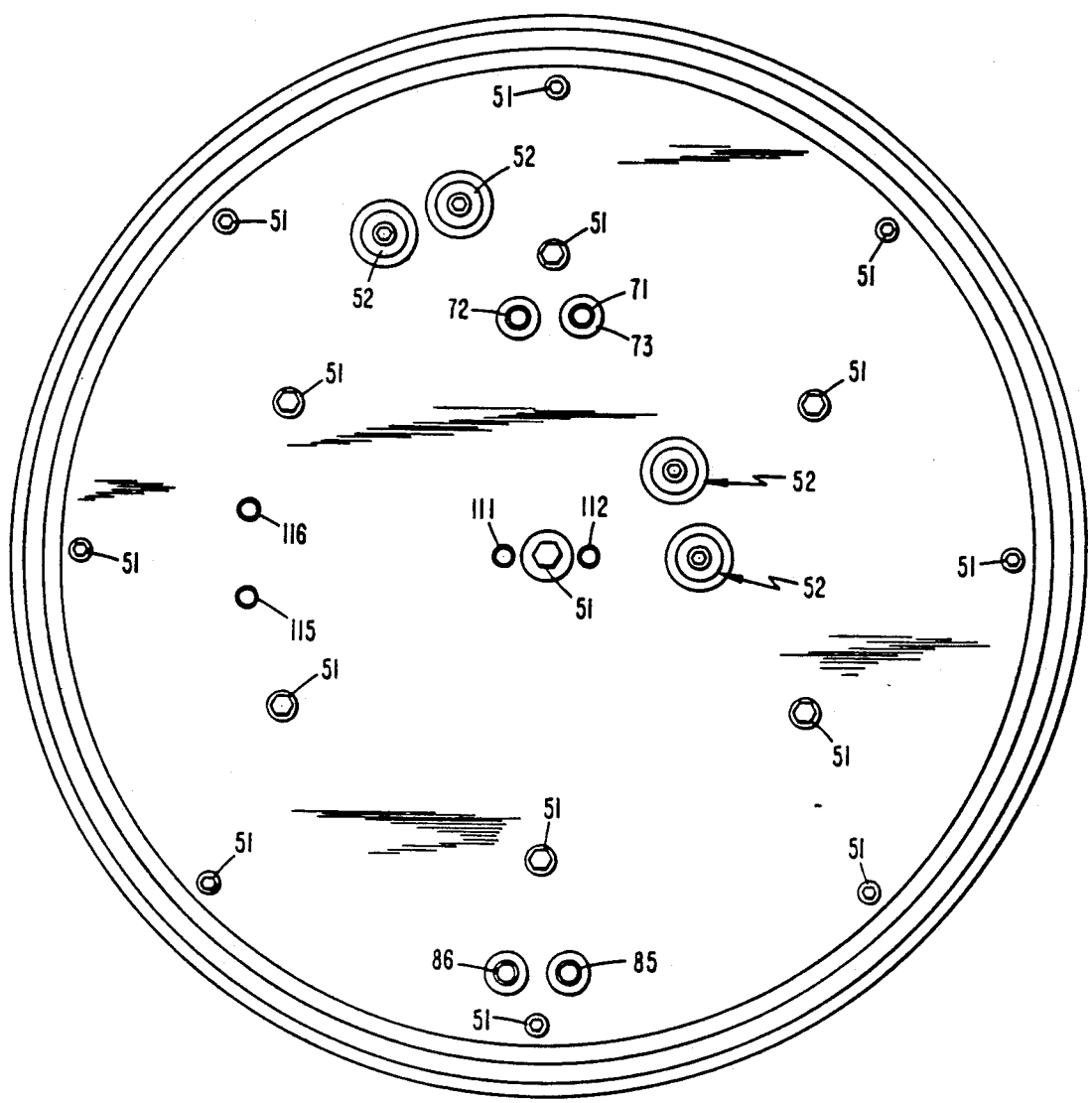

APPARATUS FOR MANUFACTURING PLANARIZED ALUMINUM FILMS

This is a continuation application of U.S. application No. 019,164, filed Feb. 26, 1987, now abandoned which is a divisional application of U.S. application No. 863,745 filed May 15, 1986 now U.S. Pat. No. 4,661,228 issued Apr. 28, 1987 which is a continuation-in-part of U.S. application No. 811,595 filed Dec. 19, 1985 now U.S. Pat. No. 4,627,904 issued Dec. 9, 1986 which is a continuation-in-part of U.S. application No. 759,722 filed July 29, 1985, now abandoned, which is a continuation-in-part of U.S. application No. 611,435 filed May 17, 1984 now U.S. Pat. No. 4,595,482 issued June 17, 1986.

FIELD OF THE INVENTION

This invention pertains to an apparatus and method for forming integrated circuit substructure which facilitates depositing a planar aluminum layer.

BACKGROUND OF THE INVENTION

High-performance, large-area integrated circuits (IC's) often require several levels of interconnect. Planarization processes which smooth and flatten the surface of an IC at various stages of fabrication are becoming essential, both for high-resolution photolithography and for adequate coverage of steps by thin films. Numerous techniques exist for planarizing the insulating layers in multilevel IC's e.g., spin-on insulators, spin-on sacrificial layers followed by nonselective etching, and RF bias sputter deposition. $CO_2$ lasers have been used in both CW and pulsed operation to rapidly flow phosphosilicate glass over aluminum interconnects.

Planarization of the insulating layers does not by itself yield a fully planar multilevel interconnect process. Severe step-coverage problems still occur where metals are deposited over deep vertical vias in an insulator. The problem is magnified if vias are vertically stacked. These difficulties are typically mitigated by tapering the via walls (which consumes valuable area), limiting their depth/width ratio, and forbidding stacked vias. Alternatively, selective deposition techniques (tungsten chemical vapor deposition or lift-off or metal pillar fabrication) show promise for filling deep vias. Yet another solution is to planarize each metal film prior to patterning. Metal planarization could be combined with insulator planarization to yield a fully planar IC process; it might also be used by itself in specialized multilevel interconnect structures where power and ground planes are interspersed between signal levels (e.g., "silicon PC boards" for advanced IC packaging). One metal planarization technique is RF bias sputtering.

One impediment to planarization of aluminum layers by RF bias sputtering is the presence of oxygen in the system which combines with the aluminum to form aluminum oxide. The melting point of aluminum oxide is much higher than that of aluminum and an aluminum film contaminated with aluminum oxide resists planarization.

Magnetron sputter devices are characterized by crossed electric and magnetic fields in an evacuated chamber into which an inert, ionizable gas, such as argon, is introduced. The gas is ionized by electrons accelerated by the electric field. The magnetic field confines the ionized gas, which forms a plasma in proximity to a target structure. The gas ions strike the target structure, causing emission of atoms that are incident on a workpiece, typically a substrate in a coating process. Generally, the magnetic field is established by a permanent magnet structure, although electromagnetic devices are increasingly being employed for this purpose. In coating applications, the magnetron sputtering devices are frequently employed to deposit metals in the manufacture of electronic integrated circuit type devices. It is also known to deposit magnetic materials in the manufacture of high density magnetic discs of a type used for magnetic disc memories.

In prior art magnetron sputtering devices, uniform coating thickness across a substrate was obtained by moving the substrates during coating. Moving the substrates also assisted in obtaining step coverage, i.e., conformal coating over step-type transitions. Of course, there are many problems in moving a substrate during operation of a sputtering device. It is also desirable in certain instances to co-deposit different materials, particularly materials which are difficult or impossible to alloy; that is, materials which are not adapted to being on a single target. In all instances, it is desirable to operate the sputtering device at as high a rate as possible.

Sputter sources incorporating only permanent magnets, the typical prior art arrangement, do not enable the plasma confining magnetic field to change over the life of the target. In consequence, the impedance of the sputter device, i.e., the ratio of the discharge voltage which establishes the electric field to the discharge current flowing in the plasma, decreases steadily as the target erodes during use. The power supplies necessary to provide the electric field are therefore relatively complicated and expensive in an attempt to match the varying sputter device impedance over the target life.

As the target surface erodes during use, the target has a tendency to create a shadow for material emitted from the source. Thereby, the gross efficiency of the sputter device decreases as the target erodes during use. Because of the shadowing effect, the rate at which material is deposited on a substrate decreases usually in a non-linear manner, as the target erodes.

One attempt to minimize the reduced deposition rate caused by the shadow effect involves revolving an assembly including the permanent magnet about an axis of the sputtering device. Revolving the magnet assembly results in a substantial improvement in the efficiency of the sputtering process near the end of target life, but a decrease in the impedance of the device still has been observed as the target erodes. In addition, the rate at which material is sputtered from the target also decreases as the target erodes with this approach. Of course, rotating the permanent magnet structure is mechanically complex.

While many of the problems associated with the permanent magnet arrangement have been obviated by using electromagnets, the electromagnet devices have generally had the disadvantage of using single targets, having relatively narrow widths of approximately one inch. There has been recently developed systems wherein the targets have been configured as assemblies having plural target elements, generally concentric with each other. In one configuration, the targets are both planar elements; in a second configuration, an inner target is planar and an outer target is concave, having an emitting surface defined by a side wall of a frustum of a cone. These prior art devices are effective to enable material to be deposited uniformly over a large area workpiece, such as a substrate being coated.

It has been observed that the relative contributions of the two targets on the workpiece change differentially as the targets erode during use. In other words, the amount of material reaching the workpiece from the first target changes relative to the amount of material reaching the workpiece from the second target as the targets are being consumed or eroded. Thus, designing a controller for multiple element target assemblies to achieve uniform impact of material on the workpiece during the useful life of the target assemblies is complex, and not straightforward. This is particularly the case for uniform deposition across relatively large area workpieces, such as a six-inch integrated circuit wafer or a hard computer storage magnetic disc. The system is also complex because of the need and desire to control the impedances of the plasma discharges during the changing conditions that occur as the targets erode.

OBJECT OF THE INVENTION

It is an object of the invention to provide an apparatus and method of forming a structure which forms a barrier to oxygen between an aluminum layer and oxygen-bearing layers to facilitate planarizing the aluminum layer.

SUMMARY OF THE INVENTION

Oxygen-bearing layers of an integrated circuit, such as layers of silicon dioxide, have the potential to contaminate a layer of aluminum formed on the oxygen-bearing layer. A layer of refractory metal silicide formed over the oxygen-bearing layer passivates the oxygen-bearing layer so that a further layer of aluminum can be planarized. In particular a layer of tantalum silicide of thickness at least 200 angstroms forms a durable layer which survives the high temperature of planarizing the aluminum layer.

In accordance with the present invention, a cathode sputter magnetron device is controlled so that material is uniformly supplied to a workpiece having a relatively large area over the lives of plural geometrically spaced targets from which material is sputtered, wherein each target is subjected to a separate plasma discharge that is confined to the associated target by a separate magnetic field. In accordance with one aspect of the invention, the uniformity is attained by controlling the relative powers of the separate plasma discharges so that the relative powers change as a function of target erosion condition.

I have found that changing the relative powers of the separate plasma discharges enables uniformity to be maintained over the lives of the targets. It is postulated that the change in the relative powers of the plasma discharges provides the desired uniformity because the degree of self-shadowing in the target elements changes differentially during consumption of the targets. The erosion profiles of the targets are such that the outer target, which erodes faster than the inner target, develops self-shadowing at a much higher rate than the inner target. Because the outer target erodes faster than the inner target, the outer target requires more power to compensate for the resulting loss of deposition efficiency as target erosion progresses.

In accordance with another important aspect of the invention, the impedances of the separate discharges are controlled as the targets erode. The impedances are controlled by varying each separate confining magnetic field. Each magnetic field is derived by an electromagnet which is supplied with a variable current that controls the impedance of each discharge. The impedance of a first of the discharges is compared with a set value therefor. The current applied to the electromagnet for the first discharge is controlled in response to the comparison. The current applied to the electromagnet for a second of the discharges is preferably controlled so it is a constant factor of the current applied to the electromagnet for the first discharge.

Preferably, the relative powers and the impedances of the discharges are controlled simultaneously to achieve the maximum desired uniform result. The powers of the discharges for the first and second targets are adjusted so that as target erosion occurs the amount of power supplied to the second target relative to the amount of power supplied to the first target increases, to overcome the tendency of the targets to cause material to be differentially incident on the workpiece as the targets erode.

According to a further feature of the invention, a cathode sputter target is held in situ and easily removed from a support structure therefor by providing bayonet slots in the target support structure, in combination with pins in the targets which engage the slots.

In the original work that was done in connection with the sputter coater of the invention, magnetic fields from a pair of magnetic circuits, one for each target discharge, were combined in a single intermediate pole piece member between a pair of the targets. I also found that the flux fields must be additively combined in the intermediate pole piece member to provide proper operation. I found that the intermediate pole piece is preferably tapered to provide optimum performance.

While one aspect of the invention is directed to a sputtering device, it is also applicable to targets per se, and in particular to a target assembly having, in the preferred embodiment, a concave surface defined by a side wall of a frustum of a cone. In the preferred embodiment, the concave surface is included at approximately 45° relative to a base of the cone, an angle which has been found to provide excellent step coverage for large area targets. Such a second target is used with a first target element initially having a planar emitting surface with a circular perimeter having a radius R2. The concave surface has inner and outer radii of R3 and R4, respectively, where $R2 < R3 < R4$. Preferably, the first target is formed as a ring having an inner radius of R1, where $R1 < R2$.

In another aspect of the invention, I have found that by applying an R.F. bias to the substrate in addition to heating the substrate, the quality of the coating is improved. In general, while low power R.F. bias improves the quality of the coating, high power R.F. bias can cause damage to the substrate due to contacting the plasma to the substrate. A magnetic mirror in the vicinity of the substrate, which can take the form of a coil around the substrate, can be used to move the plasma away from the substrate thereby increasing the R.F. bias power levels acceptable without damaging the substrate.

These and further constructional and operational characteristics of the invention will be more evident from the detailed description given hereinafter with reference to the figures of the accompanying drawings which illustrate one preferred embodiment and alternatives by way of non-limiting examples.

BRIEF DESCRIPTION OF THE DRAWINGS

FIG. 2 is a cross-sectional view of a target assembly schematically illustrated in FIG. 1, taken along the lines 2—2, FIG. 3;

FIG. 2A is the left half of FIG. 2.

FIGS. 3 and 4 are respectively top and bottom views of the assembly illustrated in FIG. 2;

DESCRIPTION OF THE PREFERRED EMBODIMENT

Figure 1:
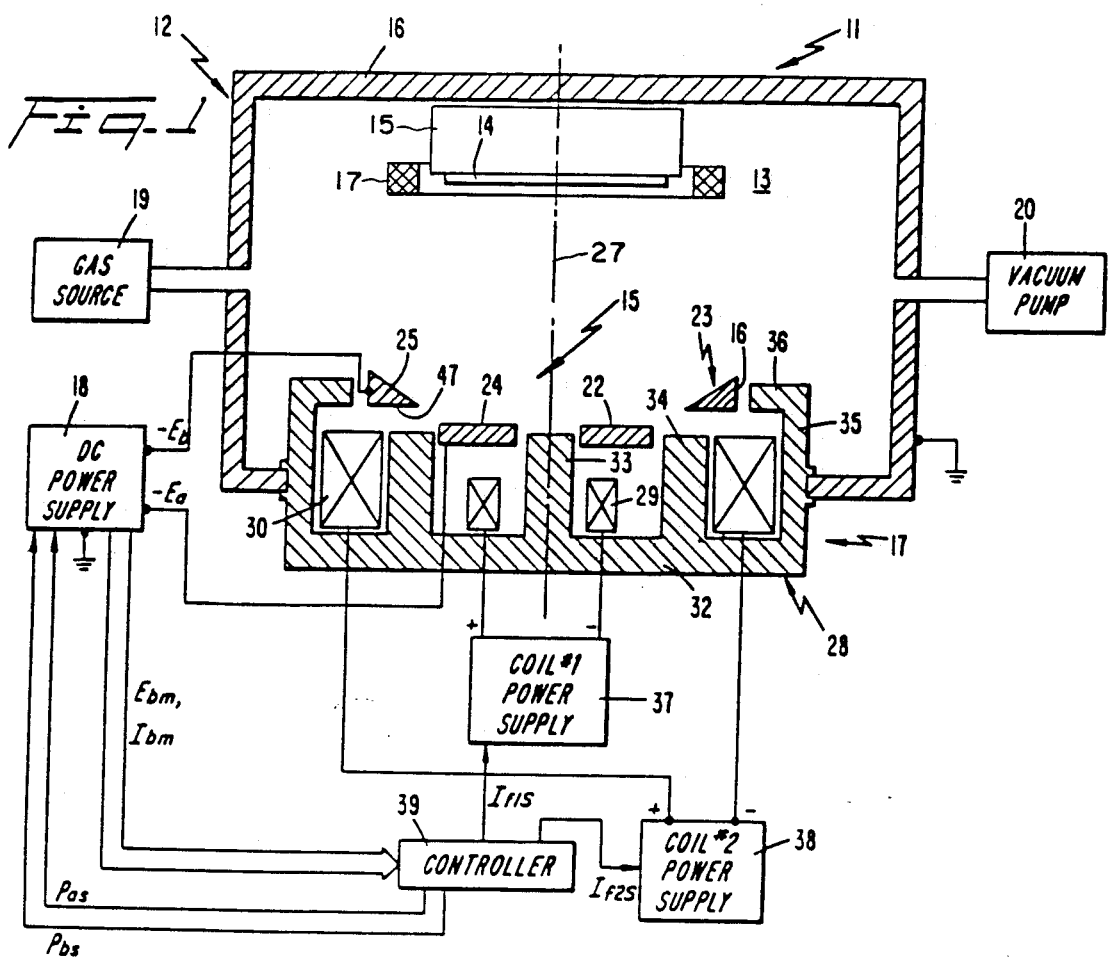
FIG. 1 is a schematic diagram of a sputtering device including a pair of target elements in combination with a controller in accordance with a preferred embodiment of the present invention.

Reference is now made to the schematic diagram, FIG. 1, wherein magnetron sputtering apparatus 11 is illustrated as including vacuum chamber 12, containing enclosed sputter coating processing or depositing volume 13 in which workpiece 14 is fixedly mounted to a heated chuck 15. Magnetic mirror coil 17 is mounted behind the substrate so that magnetic field lines are perpendicular to the substrate. Typically, substrate 14 is part of an integrated circuit wafer having a relatively large diameter, such as four to six inches, on which material is deposited for electrical interconnection by subsequent removal of selected areas of the deposited material. In such a situation non-magnetic material is usually deposited on the substrate.

It is to be understood, however, that the invention is applicable to depositing magnetic materials on substrate 14 to form devices such as magnetic disc memories. Certain modifications of the specific structure described in connection with FIGS. 2-4 are generally necessary to provide optimum results for deposition of magnetic materials. Each target for sputtering magnetic materials includes a relatively thin magnetic strip mounted on a non-magnetic, metallic holder. The magnetic strips are relatively thin, between one-quarter and one-half inch, so magnetic field lines are not affected materially by them. The magnetic material is saturated to minimize the effect thereof on the magnetic flux flowing through it. Layers of different materials can be deposited on substrate 14 by the apparatus illustrated in FIG. 1, by suitable choice of target materials for cathode assembly 15.

Chamber 12 includes metallic electrically conducting and grounded exterior housing 16, made of a material having high electric conductivity. Housing 16 is a part of an anode assembly and is generally formed as a cylinder having an axis concentric with substrate 14, in turn coaxial with target cathode assembly 15. Targets in cathode assembly 15 are maintained at negative high voltage potentials relative to ground by DC power supply 18.

To establish a plasma in processing volume 13 in the vicinity of cathode assembly 15, an inert gas, typically argon, is supplied to the processing volume from pressurized inert gas source 19. The processing volume is evacuated by vacuum pump 20. The combination of gas source 19 and vacuum pump 20 maintains processing volume 13 at a relatively low pressure, such as 7 millitorr.

In the illustrated embodiment, cathode assembly 15 includes two target elements 22 and 23, respectively, having planar, annular atom emitting surface 24 and concave atom emitting surface 25, shaped as a side wall of frustum of a cone having a base 47 at right angles to the longitudinal axis of disc shaped target element 22. Surface 25 is inclined throughout its length at an angle of 45° relative to base 47. Target elements 22 and 23 are concentric to each other, having coincident axes along axis 27 of substrate 14. The particular configurations of target elements 22 and 23 are described in detail infra, in connection with FIGS. 2-4.

Separate plasma discharges are established and confined over target elements 22 and 23. The separate discharges are confined by separate, variable magnetic fields coupled to target elements 22 and 23 by magnetic (preferably iron) pole piece assembly 28 in response to magnetic fields derived from solenoidal electromagnets 29 and 30. Pole piece assembly 28 and coils 29 and 30 are axially symmetric with and concentric to axis 27, with coil 30 being located outside of coil 29.

Pole piece assembly 28 includes disc shaped base 32, disposed at right angles with respect to axis 27, in combination with central stud 33, and rings 34 and 35. Stud 33 extends along axis 27, while rings 34 and 35 are concentric with axis 27, with the stud and each ring extending longitudinally from base 32 towards substrate 14. Stud 33 is centrally located, in a cylindrical space within coil 29, while ring 34 extends between coils 29 and 30. Ring 35 is outside of coil 30 and target element 23. Ring 35 includes inwardly directed flange 36, at right angles to axis 27. Ring 34 is proximate the outer diameter of annular target element 22 and a lower surface of target element 23, while central stud 33 is proximate the inner diameter of target element 22.

Separate, independently controlled currents are supplied to electromagnet coils 29 and 30 by DC power supplies 37 and 38, respectively. Power supplies 37 and 38 are separately controlled in response to signals derived from controller 39 so that as target elements 22 and 23 erode during use, the currents supplied to coils 29 and 30 change to maintain the discharge impedances relatively constant.

To establish the separate discharges, DC power supply 18 maintains target elements 22 and 23 at different negative DC high voltage levels $-E_a$ and $-E_b$, respectively. The detailed structures of pole piece assembly 28 and for supplying DC power to target elements 22 and 23 are described infra in connection with FIGS. 2-4.

Controller 39 responds to indications of the erosion of the target assembly including target elements 22 and 23 and the impedance of the plasma discharge associated with one of the target elements to control the power and impedance of the discharges as the target elements erode. The target erosion can be determined by the total energy supplied to target elements 22 and 23, or by deriving an electric signal proportional to the current supplied to coils 29 and 30, or by an on-line measurement of deposition uniformity using commercially available eddy current loss measuring devices. The discharge impedance is measured in response to the voltage and current in the discharge. In the described embodiment, the total energy supplied to target element 23 is computed to derive the target erosion indication.

To these ends, DC power supply 18 includes conventional devices for monitoring the voltage levels $-E_a$ and $-E_b$ and the currents $I_a$ and $I_b$ fed by supply 18 to the leads carrying voltages $-E_a$ and $-E_b$. Controller 39 responds to the measurement signals from supply 18, i.e., signals $E_{am}$, $E_{bm}$, $I_{am}$ and $I_{bm}$, and a signal indicative of the total time that a target assembly has been used to compute energy supplied to and dissipated by the target assembly and the impedance of the discharge for target cathode 23. In response to the computed signals, controller 39 supplies set point signals $I_{f1s}$ and $I_{f2s}$ to coil power supplies 37 and 38. In addition, controller 39 derives signals for power set point values $P_{as}$ and $P_{bs}$ of power supply 18. Power supply 18 is constructed so that it is a constant power device whereby the power supplied by it to target elements 22 and 23 is constant as a function of the discharge voltage and current for the elements. Thereby, the currents and voltages coupled by supplies 18 to target elements 22 and 23 vary as functions of the values of $P_{as}$ and $P_{bs}$. As the target assembly including elements 22 and 23 erodes, the ratio of the power in the discharges associated with the elements changes. Initially, the ratio of the power in the discharge for elements 22 and 23 is relatively low; the power ratio of the discharges for elements 22 and 23 increases as the target elements erode. For example, in one actual configuration, the initial ratio of the power supplied to the discharges for target elements 22 and 23 is 1:5, while the final ratio is 1:12; the power $P_b$ supplied to target element 23 exceeds the power $P_a$ supplied to target element 22.

In general, the DC currents supplied to coils 29 and 30 and the construction of pole piece assembly 28 establish magnetic flux lines in target elements 22 and 23 which intersect emitting surface 24 and pass in a first generally vertical direction, e.g. upwardly, through the boundary of annular emitting surface 24 in proximity to the outer diameter of the emitting surface. The same flux lines pass in a second generally vertical direction, e.g. downwardly, through emitting surface 24 in proximity to the inner radius of the emitting surface. Similarly, the flux lines which pass through emitting surface 25 toward axis 27 in proximity to the outer radius of the emitting surface also pass back into target element 23 at the inner radius of the target element. Thereby, separate plasma discharges are contained above the emitting surfaces 24 and 25 and the erosion profiles of target elements 22 and 23 are centered on the emitting surfaces of the targets. The angle between the magnetic field lines traversing the boundaries defined by surfaces 24 and 25 is maintained very low by the magnetic pole piece assembly 28 so that the magnetic field is very uniform over emitting surfaces 24 and 25. It is important to maintain the plasma density as uniform as possible immediately over emitting surfaces 24 and 25 to provide uniform erosion from the emitting surfaces, and thereby minimize the tendency for a "V" erosion profile which induces target self-shadowing by emitted material. Self-shadowing is a phenomenon whereby material emitted or sputtered from the target collects on the target and has a tendency to prevent escape of further material from the target toward the substrate.

The magnetic field coupled by coil 29 to pole piece assembly 28 causes magnetic flux to flow through a first magnetic circuit. The flux in the first magnetic circuit flows axially along ring 34, thence radially inward through target element 22 and slightly above emitting surface 24 thereof. From target element 22 and the space immediately above emitting surface 24, the magnetic flux flows radially inward to stud 33, thence axially along stud 33 to base 32. In base 32, the first magnetic circuit is completed by the flux flowing radially back to ring 34.

The magnetic flux established by electromagnet 30 flows through a second magnetic circuit. The flux in the second magnetic circuit flows axially through ring 34, into target element 23. The magnetic flux flows in target element 23 and slightly above emitting surface 25 thereof, thence into ring 35 through flange 36. In ring 35, the magnetic flux flows axially back to base 32, where it flows radially inwardly to ring 34 to complete the second magnetic circuit. The directions of windings of electromagnets 29 and 30 and the polarities of the currents applied to the electromagnets by power supplies 37 and 38 are such that the first and second magnetic circuit fluxes in ring 34 flow in the same direction. The flux level in ring 34 is kept below saturation; ring 34 is appreciably thicker than ring 35 for that reason.

If target elements 22 and 23 are magnetic, sufficient current is supplied by power supplies 37 and 38 to electromagnets 29 and 30 to saturate the magnetic targets so that fringing fields subsist above the targets to confine the plasma immediately above emitting surfaces 24 and 25.

Targets 22 and 23 are located relative to each other and spaced from substrate 14 to enable material to be coated uniformly across the surface of the substrate. The relative sputter rates from surfaces 24 and 25 are adjusted during the life of device 11 through the adjustment of power set points $P_{as}$ and $P_{bs}$ which respectively cause supply 18 to supply powers $P_a$ and $P_b$ to targets 22 and 23. The values of $P_{as}$ and $P_{bs}$ maintain uniform deposition on different ones of substrates 14 as emitting surfaces 24 and 25 of targets 22 and 23 erode.

Target elements 22 and 23, as well as pole piece assembly 28, are cooled, in a manner described infra in detail, in connection with FIGS. 2–4. The same structure which cools target elements 22 and 23 supplies DC operating voltages from supply 18 to them. The structures which supply cooling fluid to pole piece assembly 28 also assist in supporting the pole piece assembly.

Reference is now made to FIGS. 2–4 of the drawing, wherein there are illustrated detailed views of cathode assembly 15. It is noted from a comparison of FIGS. 2 and 3 that the cross-sectional view of FIG. 2 is along a rather circuitous path indicated by the dotted line 2—2, FIG. 3; such a cross-sectional view enables the most important features of cathode assembly 15 to be most clearly illustrated.

Disc like target element 22, in addition to including planar, annular emitting surface 24, includes tapered interior surface 41 that flares outwardly from axis 27 as it extends in a generally longitudinal direction of target 22 toward planar surface 42, opposite from and parallel to emitting surface 24. The outer perimeter of target 22 includes an axially extending segment 43 which intersects surface 42, as well as radially extending rim 44, which is disposed parallel to surfaces 24 and 42. Extending generally axially between surface 24 and rim 44 is an outer perimeter surface including beveled surface 45. On axially extending wall segment 43 are two diametrically opposed holes 46, each of which receives a (preferably) non-magnetic pin to assist in holding target element 22 in situ; preferably the pins in cut-out segments 46 are formed of a beryllium-copper alloy.

Target element 23 is formed as a ring having concave emitting surface 25, in combination with base 47 and cylindrical side wall 48. Base 47 and side wall 48 are respectively at right angles to and parallel with axis 27. Concave emitting surface 25 is formed as a wall of a frustum of a cone that is inclined 45° with respect to base 47 and wall 48 throughout the length of the surface. Diametrically opposed holes 49 in side wall 48 receive non-magnetic beryllium-copper alloy pins to hold target element 23 in situ.

Target elements 22 and 23 are arranged so that the outer radius of planar annular emitting surface 24, having a radius $R_2$, is less than the inner radius $R_3$, of inclined emitting surface 25. Of course, the outer radius $R_4$ of emitting surface 25 is greater than radius $R^3$, and the inner radius, $R_1$, of surface 24 is less than radius $R_2$.

On target element 22, there is an 0.03 inch flat 419 parallel to axis 27 formed at the intersection of the emitting surface 24 and the tapered interior surface 41. The inner radius R1 at the emitting surface 24 thus formed is 0.49 inches. The inner radius R5 at the annular rear surface 42 is 0.72 inches. There is another 0.03 inch flat 421 parallel to the axis 27 formed at the intersection of the emitting surface 24 and the beveled surface 45.

The outer radius R2 thus formed at the emitting surface 24 is 3.125 inches. The beveled surface 45 is beveled at an angle of 34 degrees to the axis 27 or an angle A of 56 degrees to the emitting surface 24. The radius R6 to the axially extending wall segment 43 is 2.72 inches and the thickness T3 of the axially extending wall segment 43 is 0.375 inches. The overall thickness T4 of the target element T4 is 0.600 inches. The pin hole 46 is a distance H of 0.162 inches above the annular rear surface 42.

On target element 23, there is a first 0.03 inch flat 427 parallel to axis 27 formed at the intersection of the emitting surface 25 and the base 47 and a second 0.03 inch flat 429 parallel to the base 47 formed at the intersection of the side wall 48 and the emitting surface 25. The inner radius R3 of the ring thus formed is 3.38 inches, the outer radius R4 is 4.84 inches, and the thickness T2 from the second flat 429 to the base 47 is 1.470 inches. The center of the holes 49 are a distance D of 0.352 inches above the base 47. There is an angle B of 45 degrees between the emitting surface 25 and the base 47.

Figure 2B:
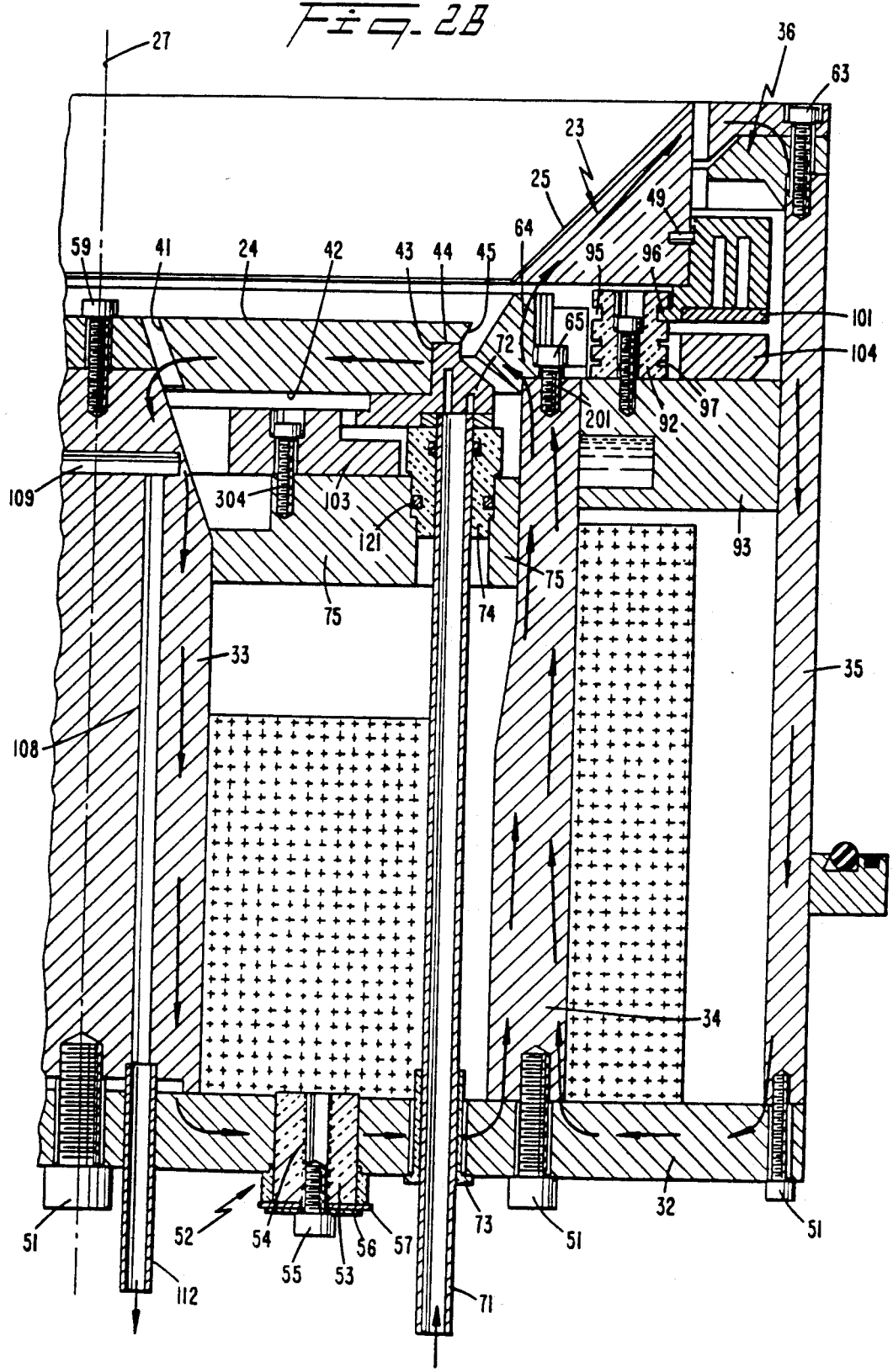
FIG. 2B is the right half of FIG. 2.

As illustrated in FIGS. 2, 2A and 2B, pole piece assembly 28 includes several individual structures whereby central pole piece stud 33, intermediate pole piece ring 34 and outer pole piece ring 35 are mounted on and secured to base 32 by screws 51. Coils 29 and 30 are mounted on base 32, with current being supplied to the coils from supplies 37 and 38 by identical feedthrough assemblies 52.

As illustrated in FIGS. 2, 2A and 2B, one of assemblies 52 includes electric insulating sleeve 53 having a relatively thick metallic coating 54 on the interior wall thereof into which is threaded metal screw 55 that bears against metal flat washer 56. A terminal lug (not shown) is connected to a lead between the head of screw 55 and washer 56 to a terminal of power supply 37. To electrically insulate the lug from the remainder of the sputtering device, dielectric washer 57 is interposed between washer 56 and the top surface of sleeve 53.

To assist in providing the desired magnetic field shape, central pole piece stud 33 is cylindrically shaped, having an upward, inwardly inclined segment that is capped by magnetic metallic (preferably ferromagnetic stainless steel) pole piece insert 69. Upper portion 58 of studs 33 and insert 69 are both inclined with respect to axis 27 by the same angle as the inclination angle of inner surface 41 of target 22. As a result, there is a constant spacing between portion 58 and insert 69 to assist in preventing penetration of plasma and sputtered metal into the underside of the source. Cap 58 is held in situ on stud 33 by non-magnetic, preferably austenitic stainless steel screw 59.

Ring 34 includes upper and lower segments, having walls parallel to axis 27, and a central segment with an interior wall that is inclined outwardly with respect to axis 27. Magnetic field saturation in the lower portion of ring 34 is avoided because of the relatively large cross sectional area presented by it to the magnetic flux flowing through it.

Ring 35 has walls of constant thickness throughout substantially the entire length thereof. At the upper end of ring 35 is inwardly extending flange 36, formed of two separate abutting metallic elements, namely exterior magnetic pole piece insert 61 and shield 62 are spaced from outer wall 48 of target 23, whereby a gap having a constant separation between the target and pole pieces is established.

To couple magnetic flux from intermediate ring 34 to both of targets 22 and 23, middle pole piece insert 64 is mounted by metal non-magnetic, preferably austenitic stainless steel, screws 65 on the top surface of the intermediate ring. Pole piece 64 is configured to provide a constant gap between it and the opposing surfaces 45 and 47 of targets 22 and 23. To this end, pole piece insert 64 includes an outwardly tapered inner cylindrical like wall 365 which extends from a plane below the plane of target surface 24 to the top of the pole piece insert. The top of pole piece 64 is defined by planar annulus 66, disposed parallel to bottom surface 47 of target 23. Surface 66 extends radially outward from axis 27 from a point just outside of the intersection of emitting surface 25 and planar surface 47 of target 23 to a point approximately one-quarter of the length of surface 47 in the radial direction. The geometry provides a constant gap between pole piece insert 64 and each of targets 22 and 23.

Target cathodes 22 and 23 are maintained at different high voltage negative potentials relative to grounded pole piece assembly 28, with target 22 being maintained at a voltage of $-E_a$ and target 23 being maintained at a potential of $-E_b$. In the presence of plasma, electric lines of force exist along surfaces 24 and 25 of targets 22 and 23, respectively, as well as in the previously mentioned gaps between targets 22 and 23 and the adjacent pole piece elements, namely central pole piece insert 69 on central pole piece 33, middle pole piece insert 64, and outer pole piece insert 61 and shield 62.

Target 22 is supplied with a voltage of $-E_a$ by axially extending metal, non-magnetic (preferably copper) tube 71 which is mechanically and electrically connected to metal, non-magnetic (preferably copper) ring 72, having an axis coincident with axis 27. Ring 72 also supports the underneath side of target 22 by abutting against intersecting horizontally and vertically extending surfaces 42 and 43 of the target. Small cut-outs provided in ring 72 act as a bayonet mount, which holds target 22 in situ using pins mounted in holes 46. Ring 72 and surface 42 abut against each other through a distance of approximately one-quarter of the radius of surface 42, between the outer edge of target 22, toward the center thereof.

Tube 71 passes through base 32, but is electrically insulated from it by virtue of axially extending, dielectric sleeve 73. The end of tube 71 proximate ring 72 is supported by sleeve like, dielectric spacer 74, in turn supported by metal, non-magnetic, preferably stainless steel, bulk head 75 which extends radially between and is connected to central pole piece 33 and intermediate pole piece 34. A clamp (not shown) fits over copper tube 71 and is connected to a lead, in turn connected to voltage terminal $E_a$ of DC power supply 18.

A portion of target 22 on the opposite side of axis 27 is supported by dielectric stud 275, having an axial bore into which non-magnetic, metal screw 76 is threaded; screw 76 extends into a threaded bore in bulk head 75 to hold stud 275 in situ. Stud 275 is provided with radially extending, axially spaced slots 77 which assist in preventing electric breakdown between the stud and adjacent metallic parts. Slots 77 have a high flow impedance to metal particles from targets 22 and 23, to prevent migration of the metal into the slots and thus preserve the electric insulating properties of the stud. Stud 275 includes a further radially extending slot 78 in which is captured horizontally extending support shoulder 79 for the bottom surface of ring 72. From the foregoing, target 22 is supported mechanically and electrically maintained at a potential of $-E_a$ and is electrically isolated from ground and target 23 by the same structure.

Figure 7:
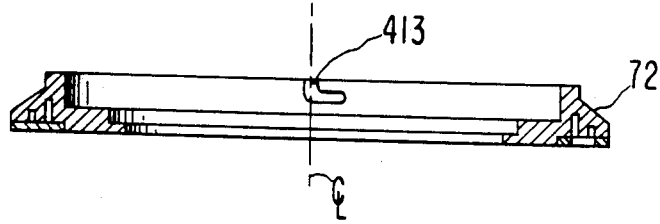
FIG. 7 is a cross-sectional view of a cooling ring assembly for the inner cathode showing the bayonet cutout.

The support structure for target 22 also enables the target to be cooled. To this end, ring 72 is provided with a pair of annular, axially extending slots 81 and 82, in fluid communication with the interior of tube 71. A cooling fluid, preferably water, supplied to the interior circumference of ring 72. Slots 81 and 82 extend around virtually the entire extent of ring 72. Water in slots 81 and 82 flows out of the slots through copper tube 70, FIG. 3, adjacent tube 71. Annular gasket 84, mounted on the bottom surface of copper ring 72, covers slots 81 and 82, except where the slots are connected to tubes 71 and 70, to provide a fluid tight seal between the slots and the remainder of the device. Tube 70 extends through base 32 in the same manner as tube 71 and is electrically isolated from the base by a sleeve identical to sleeve 73. Ring 72 includes small bayonet cutouts 413 (as shown in FIG. 7) for receiving the same non-magnetic pins which engage holes 46, to hold target 22 in situ.

In the prior art, targets were mounted to a cooling surface using bolts or other fasteners, the fasteners providing the force to make good thermal contact between the target and the cooling surface. Here, the use of bayonet mounts allows the targets to be quickly inserted in the cooling rings at room temperatures. No springs or tensioning devices are needed in the bayonet-and-pin arrangement here. Thermal contact in this invention is provided by relying on close fit between the target and the ring. The target will heat more than the cooling ring hence the target will have more thermal expansion than the cooling ring. As the target expands it is held even more closely to the cooling ring and thermal contact increases. To maintain good thermal contact the dimensions R4 and R6 given above must be formed to a tolerance of about 5 thousands of an inch.

The pins are made preferably of a non-magnetic material to avoid distortion of the field. The pin holes must be located in a portion of each target that will not be eroded prior to the end of the life of the target in order to avoid sputtering dissimilar material.

The targets can be made in a single piece (excluding pins) or each can be a compound structure as required by a particular material. For example, silicides can be formed on a mounting ring of copper or platinum foil can be formed over a base of aluminum. In the case of such compound structures the overall dimensions of the target are still as given heretofore. The use of a mounting metal with a low coefficient of thermal expansion such as copper requires even closer tolerances than specified above.

Figure 8:
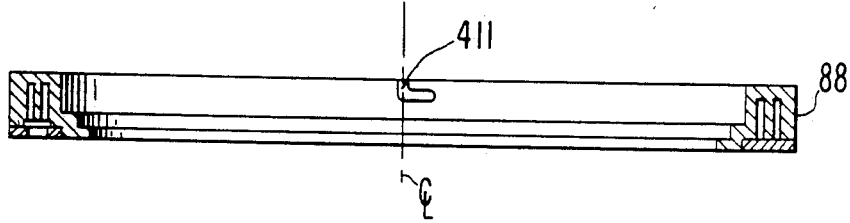
FIG. 8 is a cross-sectional view of a cooling ring assembly for the outer cathode showing the bayonet cutout.

Target 23, electrically connected to supply source voltage $-E_b$, is mechanically supported and cooled in a manner similar to that described for target 22. In particular, target 23 is electrically connected to axially extending copper tubes 85 and 86, which extend through base 32 and are electrically insulated from the base by dielectric sleeves 87, identical to sleeve 73. Current from copper tube 85 flows into ring 88, which abuts against and holds intersecting cylindrical wall 48 and planar surface 47 of target 23. Ring 88 includes small bayonet cut-outs 411 (as shown in FIG. 8) for receiving the same non-magnetic pins which engage holes 49, to hold target 23 in situ. Ring 88 is mechanically supported and electrically insulated from the remainder of the device by axially extending dielectric sleeve 91 and stud 92.

Sleeve 91 has a central bore through which copper tube 85 extends. Sleeve 91 includes shoulders which abut downwardly against metal, non-magnetic, preferably stainless steel, bulk head 93 that extends radially between and is mechanically connected to intermediate pole piece 34 and outer pole piece 35.

Along the interior wall of bulk head 93 is an annular channel 94 through which cooling fluid is circulated, as described infra. Ring support stud 92 includes a radial slot 95 which receives and carries inwardly extending flang 96 of copper ring 88. Stud 92 also includes radially extending slots 97 which perform the same function as similar slots 77 on stud 275.

To cool target 23, ring 88 is provided with a pair of annular, axially extending slots 98 and 99, in fluid communication with the interior of tubes 85 and 86. Slots 98 and 99 extend virtually around the entire extent of ring 88 in the same manner as described for slots 81 and 82 in ring 72. A fluid seal is provided for slots 98 and 99 by annular gasket 101, which abuts against and extends radially along the lower surface of ring 88 except in the region where slots 98 and 99 are connected to the interior of tubes 85 and 86.

To prevent plasma and sputtered metal from penetrating into the gap between high voltage targets 22 and 23 and the surrounding, electrically grounded parts of cathode assembly 15, metal, non-magnetic, preferably aluminum, annular spacers 103 and 104 are provided. Inner spacer 103 is mounted on and secured to bulk head 75 by metal, non-magnetic screws 304. Spacer 103 extends radially from a region slightly outside of central pole piece 33 to a region slightly inside of intermediate pole piece 34. Spacer 104 is mounted on and secured to bulk head 93 by screws 105. Spacer 104 extends radially from a position aligned with the outer wall of intermediate pole piece 34 to a position just inside of the interior wall of pole piece 35. A constant gap subsists between spacers 103 and 104 and the adjoining metal parts to minimize high voltage discharges and thereby prolong the life of the unit.

To maximize efficiency, pole piece assembly 28 and the target assembly including target elements 22 and 23 are cooled. To cool the pole piece assembly 28, central pole piece 33 includes axially and radially extending bores 107, 108 and 109. Radially extending bore 109 is in proximity to the top of pole piece 33, proximate target 22. Bores 107 and 108 are connected to a water supply and water sump by way of tubes 111 and 112 which extend through base 32. To cool pole piece 34, it includes axially extending bores 113 and 114, respectively connected to tubes 115 and 116 which extend through base 32 to a water supply and sump. At the end of bore 113 adjacent bulk head 93 is outwardly extending passage 117 through which cooling fluid flows between bore 113 and annular fluid passage 94. Thereby cooling fluid flows circumferentially about the perimeter of pole piece 34, to cool the pole piece. It has been found that it is not necessary to cool outer pole piece 35 because of the large exposed area thereof and because of its remoteness from the center of cathode assembly 15.

In operation, targets 22 and 23 expand with heating from the discharge power dissipated as material is sputtered from them. Expansion of targets 22 and 23 results in more intimate contact between the targets and support rings 72 and 88. Thereby, tight contacts are made between targets 22 and 23 and rings 72 and 88, to provide better heat transfer between the targets and rings and thereby increase cooling efficiency in transferring heat from the targets to the rings.

Vacuum integrity is maintained in the space above targets 22 and 23, as well as in the region where the plasma discharge is confined between cathode assembly 15 and substrate 14 with bulk heads 75 and 93. All elements which fit through the bulk heads are sealed to walls within the bulk heads by O-rings 121; for example, insulating sleeves 74 and 91 are respectively sealed to bulk heads 75 and 93 by O-rings 121.

Cathode assembly 15 is secured to chamber 16 by axially displaced, radially extending mounting flange 211, fixedly mounted on the exterior side wall of pole piece 35. To provide the proper seal, flange 211 includes a slot for carrying O-ring 213. Rf shield 214 is located in a further slot in flange 211.

Figure 5:
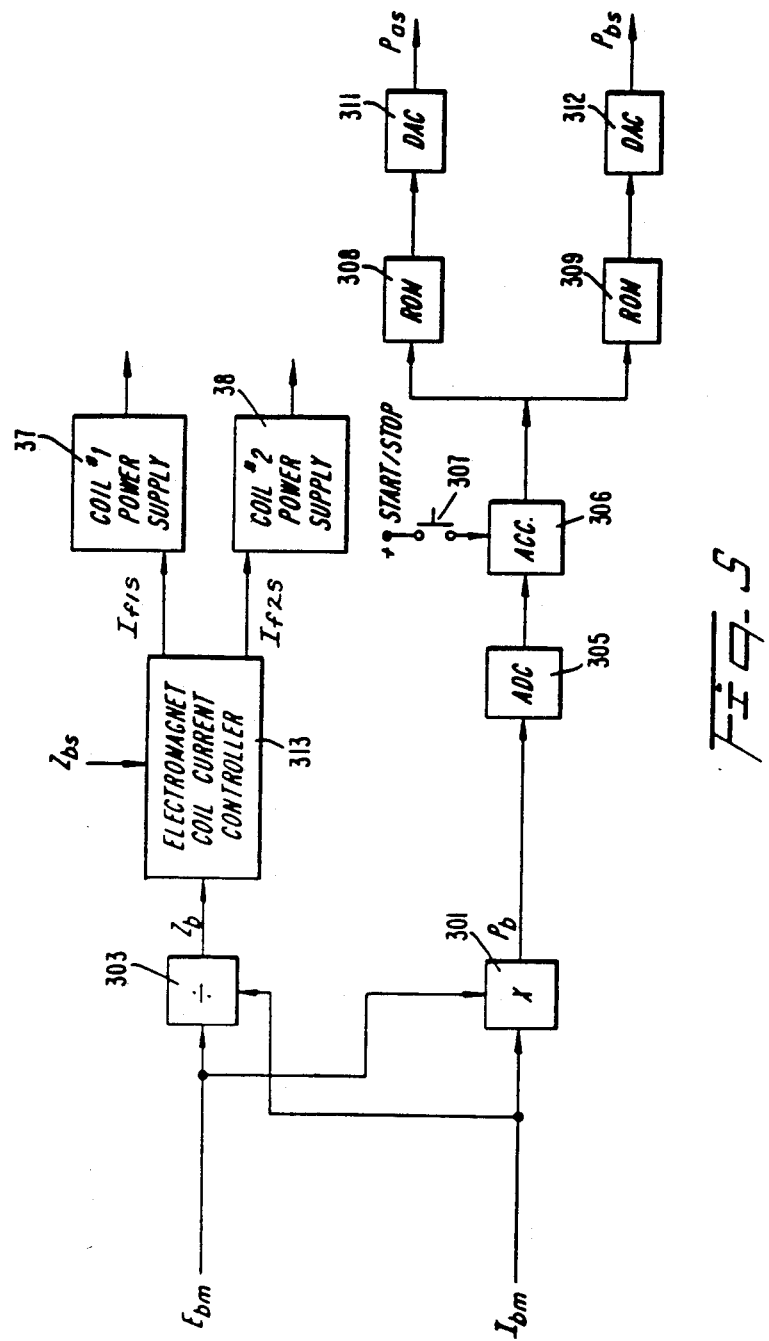
FIG. 5 is a schematic diagram of details of the controller illustrated in FIG. 1.
Figure 10:
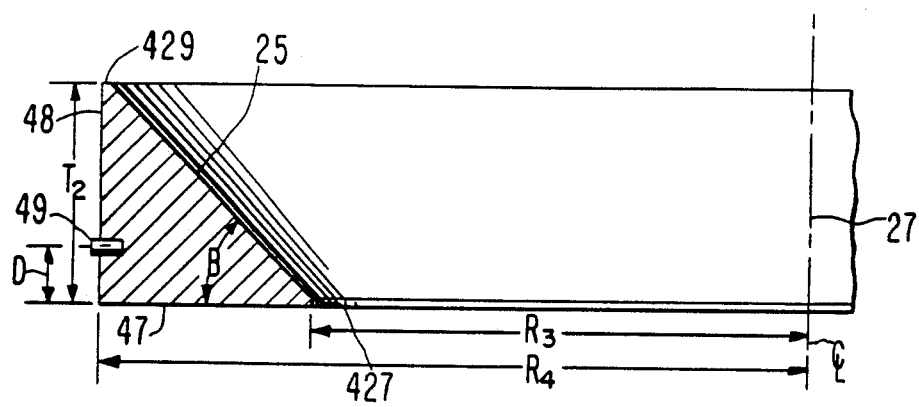
FIG. 10 is a partial cross-sectional view of the outer cathode.
Figure 9:
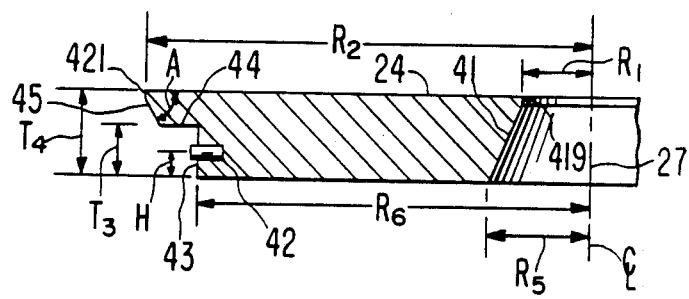
FIG. 9 is a partial cross-sectional view of the inner cathode.

Reference is now made to FIG. 5 of the drawing wherein there is illustrated a schematic diagram of controller 39, FIG. 1. Controller 39 responds to analog signals $E_{bm}$ and $I_{bm}$ derived from power supply 18 and respectively indicative of measured values for the voltage applied to target element 23, and the current in the discharge associated with target element 23. Signals $E_{bm}$ and $I_{bm}$ are applied to analog multiplier 301 and analog divider 303. The power in the discharge for target 23 is determined by multiplying signals $E_{bm}$ and $I_{bm}$ in multiplier 301. The output of multiplier 301, $P_b$, an analog signal indicative of the total instantaneous power consumed by outer target element 23, is converted into a digital signal by analog to digital converter 305.

The power indicating output signal of converter 305 is integrated over the interval while target elements 22 and 23 are operative. To this end, accumulator 306 responds to the instantaneous output of converter 305 and is enabled in response to start/stop switch 307 being in a closed condition, as occurs when material is being sputtered from target elements 22 and 23. When new target elements are inserted into the sputtering device 11, accumulator 306 is reset to zero. Thereby, accumulator 306 derives an output indicative of the energy dissipated by target element 23; the amount of dissipation of target element 23 is correlated by a scaling factor in accumulator 306 to erosion of the target.

The erosion indicating digital output signal of accumulator 306 is applied in parallel to read only memories 308 and 309. Read only memories 308 and 309 are programmed in accordance with the predetermined desired ratio of power dissipation in target elements 22 and 23 as a function of target erosion. Because DC power supply 18 supplies constant power levels to target elements 22 and 23, read only memories 308 and 309 respectively store digital signals indicative of the set point values $P_{as}$ and $P_{bs}$ for the powers to be applied to target elements 22 and 23. The digital signals continuously read out of read only memories 308 and 309 representing $P_{as}$ and $P_{bs}$ are respectively supplied to digital to analog converters 311 and 312 which derive analog signals representing $P_{as}$ and $P_{bs}$. The analog signals representing $P_{as}$ and $P_{bs}$ derived by digital to analog converters 311 and 312 are supplied to DC power supply 18.

The impedances of the discharges associated with target elements 22 and 23 are controlled as the target elements erode so that the discharge impedance associated with target element 23 is maintained constant in response to the measured impedance of the target element 23. The discharge impedance associated with target 22 need not be and is not controlled. The discharge impedance associated with target 23 is controlled by measuring the impedance of the discharge associated with target 23 and comparing the measured impedance with a set point value therefor. A resulting error signal is derived to control the current of coil power supply 38, and thereby control the impedance of the discharge associated with target element 23. The current supplied to power supply 37 for coil 29 is varied so that it is always a fixed proportion of the current coupled by supply 38 to coil 30.

To these ends, the signals $E_{bm}$ and $I_{bm}$, respectively indicative of the voltage of target 23 and the current in the discharge associated with target 23, are non-linearly combined in digital dividing network 303. Dividing network 303 derives an analog output signal representing $E_{am}/I_{am}=Z_b$, the measured impedance of the discharge associated with target 23. The measured value of the impedance of the discharge associated with target 23 is compared with a set point value therefor ($Z_{bs}$) in electromagnet coil current controller 313. Controller 313 responds to the error signal between the values of $Z_b$ and $Z_{bs}$ to derive a signal $I_{f2s}$ which is applied to constant current power supply 38 for coil 30. The ratio between the set point values for the currents fed by supplies 37 and 38 to coils 29 and 30 is constant.

Figure 6:
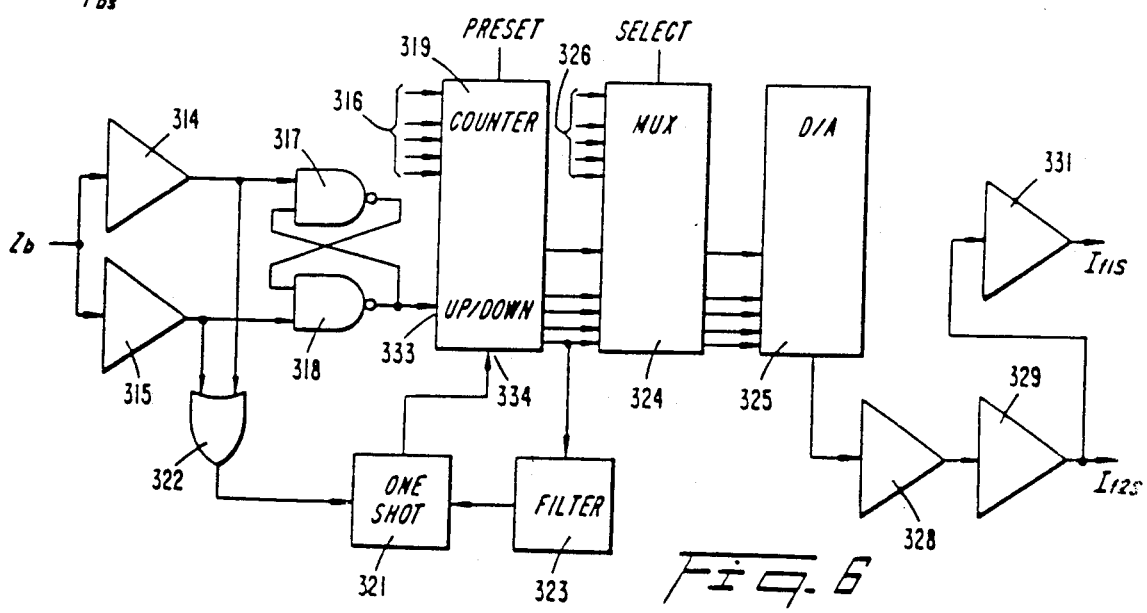
FIG. 6 is a schematic diagram of details of the controller illustrated in FIG. 5.

Reference is now made to FIG. 6 of the drawing wherein there is illustrated a detailed block diagram of circuitry included in controller 313. Coil current controller 313 responds to the measured impedance of the discharge associated with target element 23 to derive an error signal indicative of the deviation between the monitored value and the set point value $Z_{bs}$ therefor. The set point value $Z_{bs}$ is actually a range of values which define a window of acceptable values for $Z_b$. In response to the measured value of $Z_b$ being respectively above and below the acceptable range therefor, a counter is incremented and decremented. The counter is initially loaded with the value of the current fed to an unused target 23 to achieve the desired impedance for the discharge of such a target.

To these ends, the analog output signal of divider 303, FIG. 5, indicative of $Z_c$, is applied in parallel to amplitude discriminators 314 and 315. Discriminators 314 and 315 are set so that in response to the input signals thereof being above and below the acceptable range of values, binary one levels are respectively derived from them. The binary one levels derived by discriminators 314 and 315 are applied to flip-flop 316, including cross coupled NAND gates 317 and 318, respectively having inputs responsive to the outputs of discriminators 314 and 315. NAND gate 318 has an output coupled to up/down input control terminal 333 of counter 319. Counter 319 includes clock input terminal 334 responsive to an output signal of one shot 321. One shot 321 is enabled in response to a binary one being derived at the output of either of discriminators 314 or 315; to this end, the output terminals of discriminators 314 and 315 are combined OR gate 322, having an output coupled to an input terminal of one shot 321.

Counter 319 includes multiple stages, initially set by multi-bit parallel digital source 327 to a binary value commensurate with the desired or set point value for the current to achieve the impedance value $Z_{bs}$ of the discharge associated with an uneroded target element 23. Counter 319 includes a multi-bit, parallel output on which is derived a signal indicative of a control value for the current coupled by supply 38 to electromagnet 30. In response to the measured impedance value $Z_b$ for the discharge associated with target 23 being outside of the window established by discriminators 314 and 315, the output signal derived by counter 319 is incremented or decremented. The binary level of the output of NAND gate 318 determines whether counter 319 is incremented or decremented. Clocking of counter 319 is provided by the output of one shot 321.

One shot 321, when supplied with a binary one by the output of OR gate 322, supplies periodic pulses to the clock input of counter 319. The pulses are selectively delayed under the control of the output of delay circuit 323. In a manner known to those in the art delay circuit 323 selectively delays the application of output level changes from OR gate 322 to the input of one shot 321 for a period as great as a significant fraction of a second. The delay enables the value derived by counter 319 to change only slowly and thereby prevent jitter in the currents applied to coils 29 and 30. If neither discriminator 314 nor 315 derives a binary one output, no pulse is supplied by one shot 321 to counter 319.

The output signal of counter 319, indicative of a set point value, $I_{f2s}$ for the output current of power supply 38 is selectively coupled through multiplexer 324 to digital to analog converter 325. When a discharge is initiated, for example because a new workpiece 14 is in situ or a new target assembly is installed, multiplexer 324 supplies a multi-bit initial preset value to digital to analog converter 325. The initial preset value establishes a higher value of $I_{f2s}$ than during normal operation, to provide the higher magnetic field necessary to instigate an electric discharge for targets 22 and 23. The initial value of $I_{f2s}$ is derived from digital signal source 326 and coupled to an input bus of multiplexer 324 separate from the input bus to which counter 319 is responsive. Simultaneously with multiplexer 324 being initially activated to be responsive to digital source 326, instead of the output of counter 319, counter 319 is preset in response to the output of digital signal source 327 to a current value which establishes the desired initial current.

Digitial to analog converter 325 responds to the input signals supplied thereto by multiplexer 324 to derive an analog DC signal which is scaled and inverted by DC operational amplifier 328. The output of amplifier 328 is coupled to buffer amplifier 329 which feeds an input signal $I_{f2s}$ to power supply 38 for coil 30. The output signal of amplifier 329 is coupled to amplifier 331, having a constant gain factor other than unity. The DC output signal of amplifier 331 is supplied to power supply 37 for coil 29. The current fed by supply 38 to electromagnet 30 is thus a fixed proportion of the current coupled by supply 37 to electromagnet 29. Thereby, the ratio of the magnetic field currents supplied to electromagnets 29 and 30 remains constant over the operating life of the target assembly including elements 22 and 23. The magnetic field shapes resulting from activation of electromagnets 29 and 30 thus remain fixed even though the magnitudes of the fields associated with electromagnets 29 and 30 change. The currents coupled by supplies 37 and 38 to electromagnets 29 and 30 are adjusted by the described feed back loop to maintain fixed effective impedances for the discharges associated with target element 23. The power utilization of supply 18 is thereby increased.

Low power R. F. bias is known to improve the conformality of films over substrate topographics in low-deposition rate apparatus. In the high deposition rate apparatus according to the invention, high R.F. power would be needed for effectiveness. But high R.F. power can cause localized hazing and melting of the deposited films. It is an important aspect of the invention that placing a magnetic mirror in the vicinity of the substrate moves the plasma sufficiently away from the substrate to allow the application of high power R.F. The magnetic mirror can take the form of the coil 17 located behind the front surface of the substrate which imposes magnetic field lines perpendicular to the substrate. The coil 17 can also be located outside the vacuum system. The direction of current in the magnetic mirror coil is that which moves the plasma away from the substrate and opposes the prevailing magnetic field from the source. For an aluminum sputtering process the wafer is heated to about 500° C. Apparatus for heating the substrate during deposition is disclosed in U.S. Pat. Nos. 4,261,762 to King and 4,512,391 to Harra, the disclosures of which are hereby incorporated by reference. R.F. bias of the order of 1.5 W/cm$^2$ for a 150 mm diameter wafer can thereby be applied to the wafer which in combination with the heating of the wafer and high deposition rate of the sputter source of the invention result in a film having a high conformity to the surface of the substrate. This power density corresponds to 350–400 volts of DC self-bias at the substrate.

The use of the magnetic mirror solenoid 17, while providing advantages of permitting high power R.F. bias, has a disadvantage of decreasing the life of the target if too much magnetic field is generated at the magnetic mirror solenoid. A control circuit which provides current to the magneticd mirror solenoid proportional to the current to sputtering source coils iminimizes this problem. In the preferred embodiment the current y to the mirror solenoid takes the form $y = A + BX$ where A and B are constants and X is the current to the magnetron sputter source coils.

Figure 11:
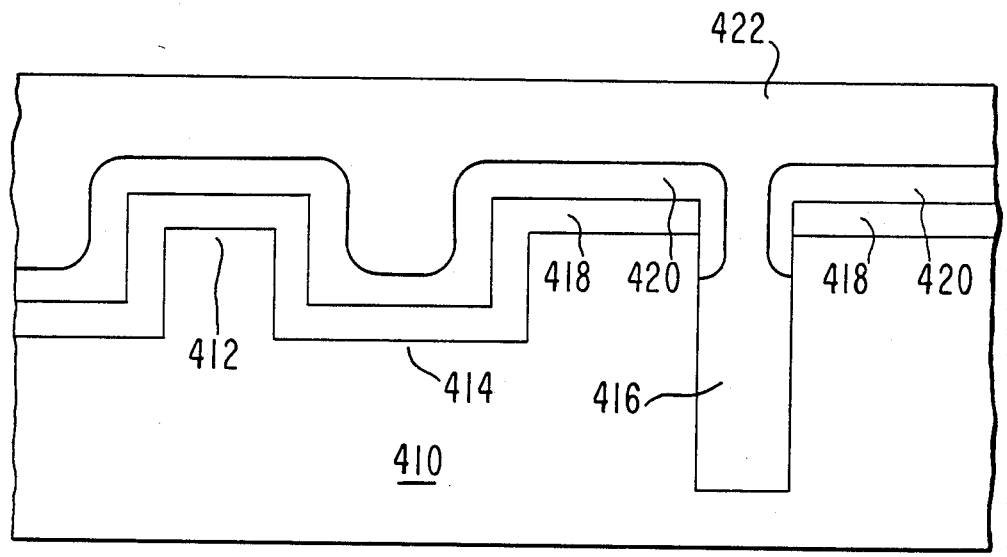
FIG. 11 shows a schematic cross-section of an integrated circuit structure according to the invention.

FIG. 11 shows a schematic cross section of an integrated circuit structure according to the invention. A conventional circuit 410 has high points 412, low points 414 and via holes to lower layers 416. An oxygen-bearing layer 418, such as a silicon dioxide layer is deposited to provide electrical insulation between lower layers and subsequent conductive layers. In order to provide a barrier to oxygen a layer of refractory metal silicide 420 is formed over the oxygen-bearing layer. A layer of aluminum 422 can then be formed over the refractory metal silicide layer and planarized.

In the alternative, the refractory metal silicide layer can be formed by chemical vapor deposition process such as shown in U.S. Pat. Nos. 3,540,920 and 3,658,577 to Wakefield and 4,392,299 to Shaw.

The invention can be most successfully practiced in a sputter coating machine incorporating multiple stations so that at least two steps of sputter coating can be performed in sequence without exposing the wafer to air. Such a sputter machine is disclosed in U.S. Pat. 4,306,731 to R. Howard Shaw, the disclosures of which are hereby incorporated by reference.

It is an important aspect of the invention that the refractory metal silicide layer which is isolating the oxygen-bearing layer is not exposed to oxygen-bearing gas, such as air, before the aluminum layer is formed on the refractory metal silicide surface. In the alternative, if the refractory metal silicide layer is formed in a first machine and the aluminum layer in a second machine with exposure to air between machines, then an additional etch step must be performed in the second machine to remove the oxygen from the surface of the refractory metal silicide before forming the aluminum layer.

Refractory metal silicide layers are a particularly suitable passivating layer because they are durable and resistant to heat in the subsequent aluminum planarization step. Examples of refractory metal silicides are Ti, Ta, W and Mo silicides. Also, silicides of Zr, Hf, Cr, Ni, V, Co and Pt would be suitable.

As an example, sitable layers of Ta Silicide in excess of 200 angstroms thick were sputtered on layers of silicon dioxide at substrate temperatures in excess of 400° C. The layer must be at least 200 Angstroms thick to assure good coverage and sufficient thickness to prevent damage during the aluminum deposition. The temperature of the substrate must be in excess of 400° C. to assure good bonding of the tantalum silicide to the substrate. Temperatures below 400° C. tend to cause pinhole defects in the Ta Silicide.

Ta Silicide sputter targets in the ratio of 2.6 parts silicon to one part tantalum proved satisfactory. Fractionation is thought to occur to reduce this to 2.4 to 1 on the substrate.

Other refractory metals are suitable but in the case of certain metals, such as tungsten, which dissolve in aluminum a thicker metal silicide layer must be used to compensate for the solution.

A structure formed according to the invention as disclosed above has the advantages of allowing a fast process, being inexpensive and not requiring an especially good vacuum.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. An apparatus coating a semiconductor wafer, comprising:
 a vacuum chamber including support means for supporting a wafer in a positiion to be coated;
 magnetron sputter means for forming a thin layer by sputter deposition in a plasma onto the wafer in said support means, said magnetron sputter means including anode and planar cathode means for depositing a uniform coat on the semiconductor wafer facing the surface of the wafer to be coated and including first magnetic means for controlling a plasma generated between said anode and cathode means;
 second magnetic means positioned in juxtaposition to said support means for supporting a wafer for repelling said plasma from the surface of the wafer in said support means.

2. The apparatus of claim 1 wherein said magnetron sputter means including first magnetic means includes means for generating a magnetic field of a first polarity for controlling said plasma and wherein said second magnetic means generates a magnetic field of a second polarity, said second polarity being opposite said first polarity in order to repel said plasma from the wafer in said support means.

3. The apparatus of claim 2 including means for providing an R.F. bias to the wafer.

4. The apparatus of claim 1 including means for heating the wafer from behind while sputtering.

5. The apparatus of claim 1 in which said second magnetic means comprises a solenoid coil behind the wafer in said support means.

* * * * *